US007805279B2

(12) United States Patent
Ogushi et al.

(10) Patent No.: US 7,805,279 B2
(45) Date of Patent: Sep. 28, 2010

(54) REMOTE MAINTENANCE SYSTEM

(75) Inventors: Nobuaki Ogushi, Utsunomiya (JP); Hirohisa Ohta, Kawagoe (JP); Yoshito Yoneyama, Kawasaki (JP); Masaya Ogura, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 119 days.

(21) Appl. No.: 11/438,440

(22) Filed: May 23, 2006

(65) Prior Publication Data

US 2006/0282188 A1 Dec. 14, 2006

Related U.S. Application Data

(60) Continuation of application No. 11/117,455, filed on Apr. 29, 2005, now Pat. No. 7,062,343, which is a division of application No. 09/988,573, filed on Nov. 20, 2001, now Pat. No. 6,963,786, which is a division of application No. 08/902,160, filed on Jul. 29, 1997, now Pat. No. 6,385,497.

(30) Foreign Application Priority Data

| Jul. 31, 1996 | (JP) | ................................. 8-202057 |
| Sep. 24, 1996 | (JP) | ................................. 8-251623 |
| Jun. 24, 1997 | (JP) | ................................. 9-167233 |

(51) Int. Cl.
*G06F 11/30* (2006.01)
*G06F 19/00* (2006.01)

(52) U.S. Cl. ...................... 702/184; 702/182; 702/183; 702/185; 702/188; 700/108; 700/109; 700/110; 707/609; 707/705; 714/25

(58) Field of Classification Search ................ 700/108; 702/184; 714/27, 37, 57, 805
See application file for complete search history.

(56) References Cited

U.S. PATENT DOCUMENTS 4,390,953 A * 6/1983 Johnstone ................... 700/177

(Continued)

FOREIGN PATENT DOCUMENTS

DE 19506764 8/1995

(Continued)

OTHER PUBLICATIONS

'Human-Computer Interaction and Cooperation for Supervisory Control of Large-Complex Systems' by Inagaki et al., from Lecture Notes in Computer Science; vol. 585, Proceedings of the A Selection of Papers from the Second International Workshop on Computer Aided Systems Theory, published in 1991.*

(Continued)

*Primary Examiner*—Henry W Tsai
*Assistant Examiner*—Steven G Snyder
(74) *Attorney, Agent, or Firm*—Fitzpatrick, Cella, Harper & Scinto

(57) ABSTRACT

Factories (102-104) have host computers (107) for monitoring industrial equipment (106). Each host computer (107) is connected to a management host computer (108) on a vendor (101) side through the internet (105). The host computer (107) on the factory side detects occurrence of a trouble of the industrial equipment (106) and notifies the vendor side of status information representing a trouble state. In response to this, the host computer (108) on the vendor side notifies the factory side of response information representing a countermeasure against the trouble state.

11 Claims, 9 Drawing Sheets

U.S. PATENT DOCUMENTS

| | | | | |
|---|---|---|---|---|
| 4,517,468 | A | | 5/1985 | Kemper et al. ................. 290/52 |
| 4,847,795 | A | * | 7/1989 | Baker et al. ................. 702/184 |
| 5,212,645 | A | | 5/1993 | Wildes et al. ............... 364/463 |
| 5,225,997 | A | * | 7/1993 | Lederer et al. .............. 702/185 |
| 5,243,377 | A | | 9/1993 | Umatate et al. ............... 355/53 |
| 5,245,554 | A | * | 9/1993 | Tsuyama et al. ............ 702/185 |
| 5,299,027 | A | | 3/1994 | Nakamura et al. .......... 358/403 |
| 5,311,562 | A | | 5/1994 | Palusamy et al. ........... 376/215 |
| 5,315,711 | A | | 5/1994 | Barone et al. ............... 395/275 |
| 5,350,547 | A | * | 9/1994 | Yamaguchi et al. ........ 264/40.1 |
| 5,351,247 | A | * | 9/1994 | Dow et al. ..................... 714/26 |
| 5,383,113 | A | | 1/1995 | Kight et al. ................. 364/401 |
| 5,432,715 | A | | 7/1995 | Shigematsu et al. ..... 364/132 X |
| 5,458,732 | A | | 10/1995 | Butler et al. ................... 216/61 |
| 5,461,570 | A | * | 10/1995 | Wang et al. ................. 700/110 |
| 5,483,530 | A | | 1/1996 | Davis et al. ................... 370/79 |
| 5,533,093 | A | * | 7/1996 | Horton et al. ................. 379/21 |
| 5,544,320 | A | | 8/1996 | Konrad ................. 395/200.09 |
| 5,591,299 | A | | 1/1997 | Seaton et al. ............... 700/121 |
| 5,594,663 | A | | 1/1997 | Messaros et al. ........... 700/110 |
| 5,610,689 | A | | 3/1997 | Kamiya et al. ................ 399/31 |
| 5,619,307 | A | | 4/1997 | Machino et al. ............... 399/11 |
| 5,680,521 | A | | 10/1997 | Pardo et al. ................. 395/112 |
| 5,689,589 | A | | 11/1997 | Gormish et al. ............. 382/239 |
| 5,691,895 | A | | 11/1997 | Kurtzberg et al. ............. 700/29 |
| 5,694,325 | A | | 12/1997 | Fukuda et al. ......... 364/468.28 |
| 5,696,686 | A | * | 12/1997 | Sanka et al. ................. 700/110 |
| 5,696,901 | A | | 12/1997 | Konrad ................. 395/200.09 |
| 5,710,700 | A | | 1/1998 | Kurtzberg et al. ............. 700/29 |
| 5,724,511 | A | | 3/1998 | Moritomo ................... 709/245 |
| 5,726,920 | A | | 3/1998 | Chen et al. .................. 702/108 |
| 5,761,064 | A | | 6/1998 | La et al. ...................... 700/110 |
| 5,802,176 | A | | 9/1998 | Audebert .................... 713/184 |
| 5,832,126 | A | | 11/1998 | Tanaka ........................ 382/239 |
| 5,835,726 | A | | 11/1998 | Shwed et al. ............... 709/229 |
| 5,872,915 | A | | 2/1999 | Dykes et al. ............ 395/188.01 |
| 5,897,493 | A | * | 4/1999 | Brown ......................... 600/300 |
| 5,923,247 | A | | 7/1999 | Dowden et al. ............. 340/506 |
| 5,950,150 | A | | 9/1999 | Lloyd et al. ................. 702/183 |
| 5,951,611 | A | | 9/1999 | La Pierre ...................... 701/29 |
| 5,963,444 | A | | 10/1999 | Shidara et al. .................. 700/7 |
| 5,963,884 | A | | 10/1999 | Billington et al. ............. 702/56 |
| 5,974,444 | A | | 10/1999 | Konrad ........................ 709/203 |
| 5,984,498 | A | | 11/1999 | Lem et al. ........................ 700/2 |
| 5,995,916 | A | * | 11/1999 | Nixon et al. ................. 702/182 |
| 6,125,390 | A | * | 9/2000 | Touboul ...................... 709/223 |
| 6,185,546 | B1 | | 2/2001 | Davis ............................ 705/51 |
| 6,226,752 | B1 | | 5/2001 | Gupta et al. ................. 713/201 |
| 6,728,660 | B2 | * | 4/2004 | Bjornson ..................... 702/185 |
| 6,785,623 | B2 | * | 8/2004 | Higgins ......................... 702/81 |
| 6,853,959 | B2 | * | 2/2005 | Ikeda et al. .................. 702/188 |
| 2002/0022969 | A1 | * | 2/2002 | Berg et al. ....................... 705/1 |
| 2002/0049053 | A1 | * | 4/2002 | Nomura et al. ............. 455/423 |
| 2004/0176868 | A1 | * | 9/2004 | Haga et al. .................. 700/121 |

FOREIGN PATENT DOCUMENTS

| | | |
|---|---|---|
| EP | 0051861 | 5/1982 |
| FR | 2688643 | 9/1993 |
| JP | 01-155799 | 6/1989 |
| JP | 02-277396 | 11/1990 |
| JP | 04-028238 | 1/1992 |
| JP | 5-73745 | 3/1993 |
| JP | 05-143611 | 6/1993 |
| JP | 07-128098 | 5/1995 |
| JP | 08-036415 | 2/1996 |
| JP | 08-037157 | 2/1996 |
| JP | 08-129497 | 5/1996 |
| JP | 8-161200 | 6/1996 |
| JP | 08-115125 | 7/1996 |
| JP | 63-166211 | 7/1998 |

OTHER PUBLICATIONS

'Rule-Based Systems' by Frederick Hayes-Roth, Communications of the ACM, Sep. 1985.*

Gaines, et al., "Mediator: An Intelligent Information System Supporting the Virtual Manufacturing Enterprise," Knowledge Science Institute and Division of Manufacturing Engineering University of Calgary; 0-7803-2559, Jan. 1995, pp. 964-969.

"Manufactory Network Consulting System", Journal of Japan Society for Fuzzy Theory and Systems, vol. 7, No. 6, pp. 1134-1140 (1995).

* cited by examiner

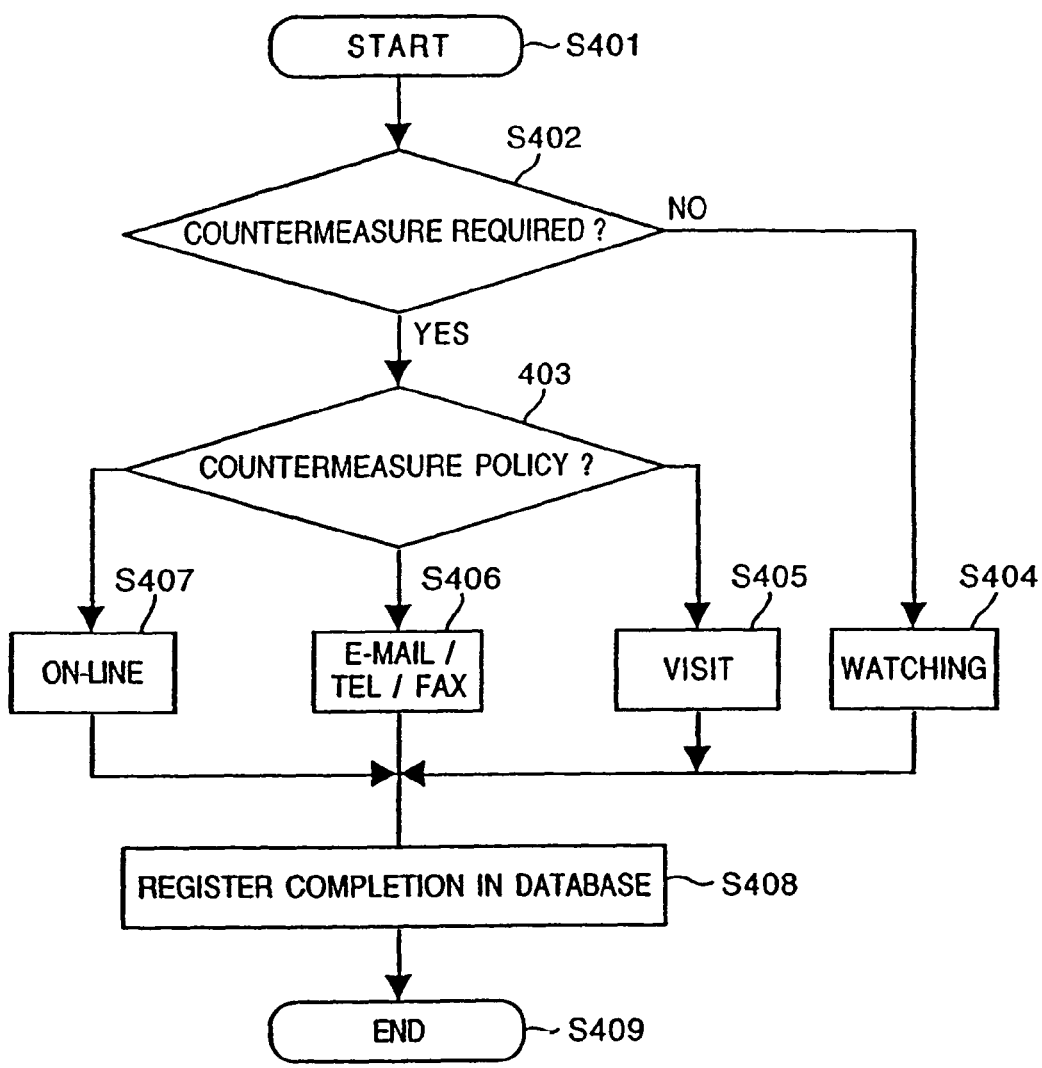

FIG. 5

| | |
|---|---|
| URL | http://www.maintain.cojp/db/input.html |

TROUBLE DATABASE INPUT WINDOW

INPUT MODEL **********  ~401
CASE  OPERATION ERROR (INITIALIZATION ERROR) ~403
MODEL S/N  465NS4580001  ~402
EMERGENCY DEGREE  D  ~405
TROUBLE STATE  LED IS KEPT FLICKERED IN INITIALIZATION  ~406
COUNTERMEASURE  TURN ON POWER SWITCH AGAIN (PRESS RED BUTTON IN INITIALIZATION)  ~407
PROGRESS  TENTATIVE COUNTERMEASURE TAKEN  ~408

(SEND) (RESET)

/410 LINK TO RESULT LIST DATABASE   /411 SOFTWARE LIBRARY   /412 OPERATION GUIDE

REMOTE MAINTENANCE SYSTEM

This application is a continuation of application Ser. No. 11/117,455, filed Apr. 29, 2005, now U.S. Pat. No. 7,062,343, which issued Jun. 13, 2006, which is a divisional of application Ser. No. 09/988,573, filed Nov. 20, 2001, now U.S. Pat. No. 6,963,786, which issued Nov. 8, 2005, which is a divisional of application Ser. No. 08/902,160, filed Jul. 29, 1997, now U.S. Pat. No. 6,385,497, which issued May 7, 2002, the contents all of which are incorporated by reference herein.

BACKGROUND OF THE INVENTION

The present invention relates to a remote maintenance system for maintaining an industrial equipment installed at a remote location.

Maintenance against a trouble in an industrial equipment requiring maintenance, such as a semiconductor device manufacturing apparatus has been made such that, upon occurrence of a trouble, maintenance personnel instruct a countermeasure to an operator for the manufacturing apparatus through telephone or facsimile communication or directly visit a factory where the manufacturing apparatus is installed. This also applies to periodical maintenance.

Along with recent increases in investment in the semiconductor industries, the number of installed production equipment increases to cause a chronic shortage in maintenance personnel. To achieve a low cost, production sites have been distributed at domestic and foreign remote locations. Under these circumstances, it becomes more difficult to provide countermeasures against troubles and periodic maintenance. The distributed production locations result in distribution of information about maintenance of manufacturing apparatuses. This makes it difficult to perform centralized management of information. The experiences of past troubles cannot be effectively utilized.

SUMMARY OF THE INVENTION

The present invention has been made in consideration of the above situation, and has as its object to immediately and efficiently perform maintenance of industrial equipment installed at remote locations.

According to the present invention, the foregoing object is attained by providing a remote maintenance system for maintaining an industrial equipment installed at a remote location, the system comprising monitor means for monitoring an operating state of one or a plurality of industrial equipment, and management means for managing maintenance of the industrial equipment while communicating information associated with maintenance of the industrial equipment with the monitor means through the internet.

Another aspect is attained by providing a monitor apparatus arranged on an industrial equipment side to constitute a remote maintenance system for maintaining an industrial equipment installed at a remote location, comprising, obtaining means for detecting occurrence of a trouble of one or a plurality of industrial equipment and obtaining status information representing a state of the trouble, and communication means for notifying, through the internet, a management apparatus for performing centralized maintenance management of the industrial equipment of status information obtained by the obtaining means, and for receiving response information sent from the management apparatus through the internet in response to notification of the status information.

In another aspect of the present invention, the foregoing object is attained by providing a management apparatus arranged on a vendor side to constitute a remote maintenance system for maintaining an industrial equipment installed at a remote location, comprising, communication means for communicating, through the internet, with each monitor means of at least one factory in which a monitor apparatus is arranged to monitor an operating state of at least one industrial equipment, and corresponding means for determining a countermeasure against a trouble on the basis of status information associated with a state of the trouble of the industrial equipment, which is received by the communication means from the monitor apparatus, and causing the communication means to notify the corresponding monitor apparatus of response information based on the determined countermeasure.

In still another aspect of the present invention, the foregoing object is attained by providing a remote maintenance method of maintaining an industrial equipment installed at a remote location, comprising the steps of, communicating, through the internet, maintenance information between a first vendor for supplying a first industrial equipment, a second vendor for supplying a second industrial equipment, a first factory in which the first and second industrial equipments are installed, and a second factory in which the first and second industrial equipments are installed, causing the first vendor to perform centralized maintenance management of the first industrial equipments installed in the first and second factories, and causing the second vendor to perform centralized maintenance management of the second industrial equipments installed in the first and second factories.

Further objects, features and advantages of the present invention will be apparent from the following description of embodiments of the present invention with reference to be accompanying drawings.

BRIEF DESCRIPTION OF THE DRAWINGS

FIG. 4 is a flow chart showing an implementation to be taken by a person in charge in the department of maintenance;

FIG. 5 is a view showing an input window example serving as the user interface of a trouble database;

DETAILED DESCRIPTION OF THE PREFERRED EMBODIMENTS

First Embodiment of Remote Maintenance System for Industrial Equipment

Figure 1:
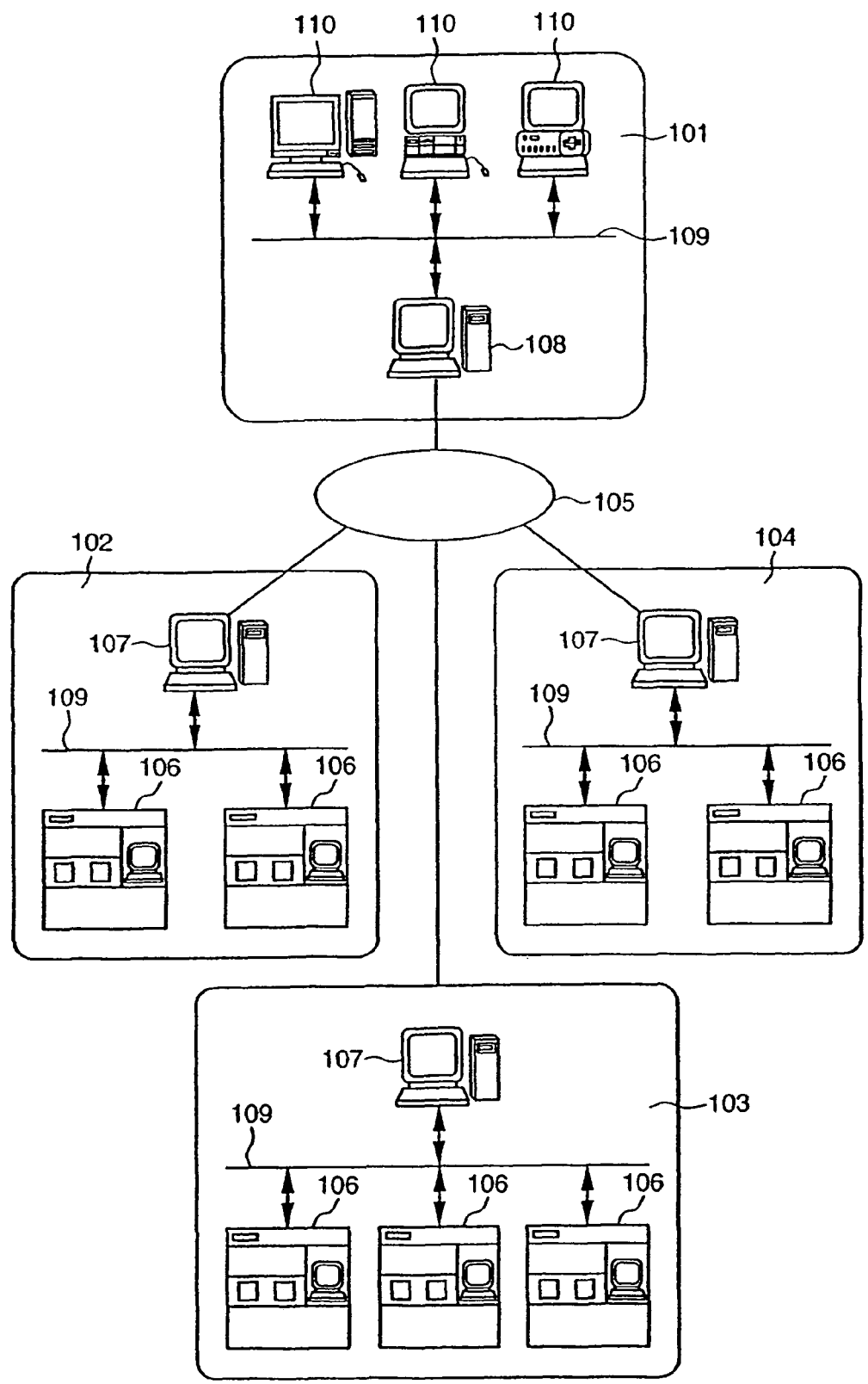
FIG. 1 is a schematic view of a remote maintenance system for an industrial equipment according to the first embodiment of the present invention.

FIG. 1 is a schematic view showing the remote maintenance system for an industrial equipment according to a preferred embodiment of the present invention. Reference numeral 101 denotes an office of a vendor (apparatus supply maker) for providing industrial equipments. This embodiment assumes, as industrial equipments, semiconductor manufacturing apparatuses used in semiconductor manufacturing factories. Examples of the semiconductor manufacturing apparatuses are preprocessing equipments (e.g., an exposure apparatus, a coating/developing apparatus, and an annealing apparatus), and postprocessing equipments (e.g., an assembling apparatus and an inspection apparatus).

Reference numerals 102 to 104 denote production factories of at least one semiconductor manufacturing maker serving as the user of industrial equipments. That is, the production factories 102 to 104 may belong to different makers or one maker (e.g., preprocessing and postprocessing factories).

A plurality of industrial equipments 106, a LAN (intranet) 109 for connecting these equipments 106, and a host computer 107 serving as a monitor apparatus for monitoring the operating states of the respective industrial equipments 106 are arranged in each of the factories 102 to 104.

The host computer 107 in each of the factories 102 to 104 is connected to a host computer 108 serving as the management apparatus on a vendor 101 side through the internet 105 serving as a worldwide communication means. The host computer 107 notifies status information (e.g., the state of the corresponding industrial equipment in trouble) representing the operating state of the corresponding industrial equipment 106 from the factory side to the vendor side. At the same time, the host computer 107 receives response information (e.g., information for instructing a countermeasure against the trouble, or a countermeasure program or its data) from the vendor side in response to the above notification. The status information and/or the response information will be referred to as maintenance information thereinafter.

In communication between the factories 102 to 104 and the vendor 101 and LAN communication in each factory, a packet communication protocol (TCP/IP) generally used in the internet is used.

The host computer 108 on the vendor 101 side can instantaneously grasp the operating states of the industrial equipments 106 in the user factories 102 to 104 through the internet 105. The maintenance information representing the operating state and the maintenance state can be looked up from computers in other departments of the vendor 101, e.g., computers 110 in the manufacturing department and the department of development in addition to the department of maintenance. The maintenance information can be fed back to the manufacturing department and the department of development.

Figure 2:
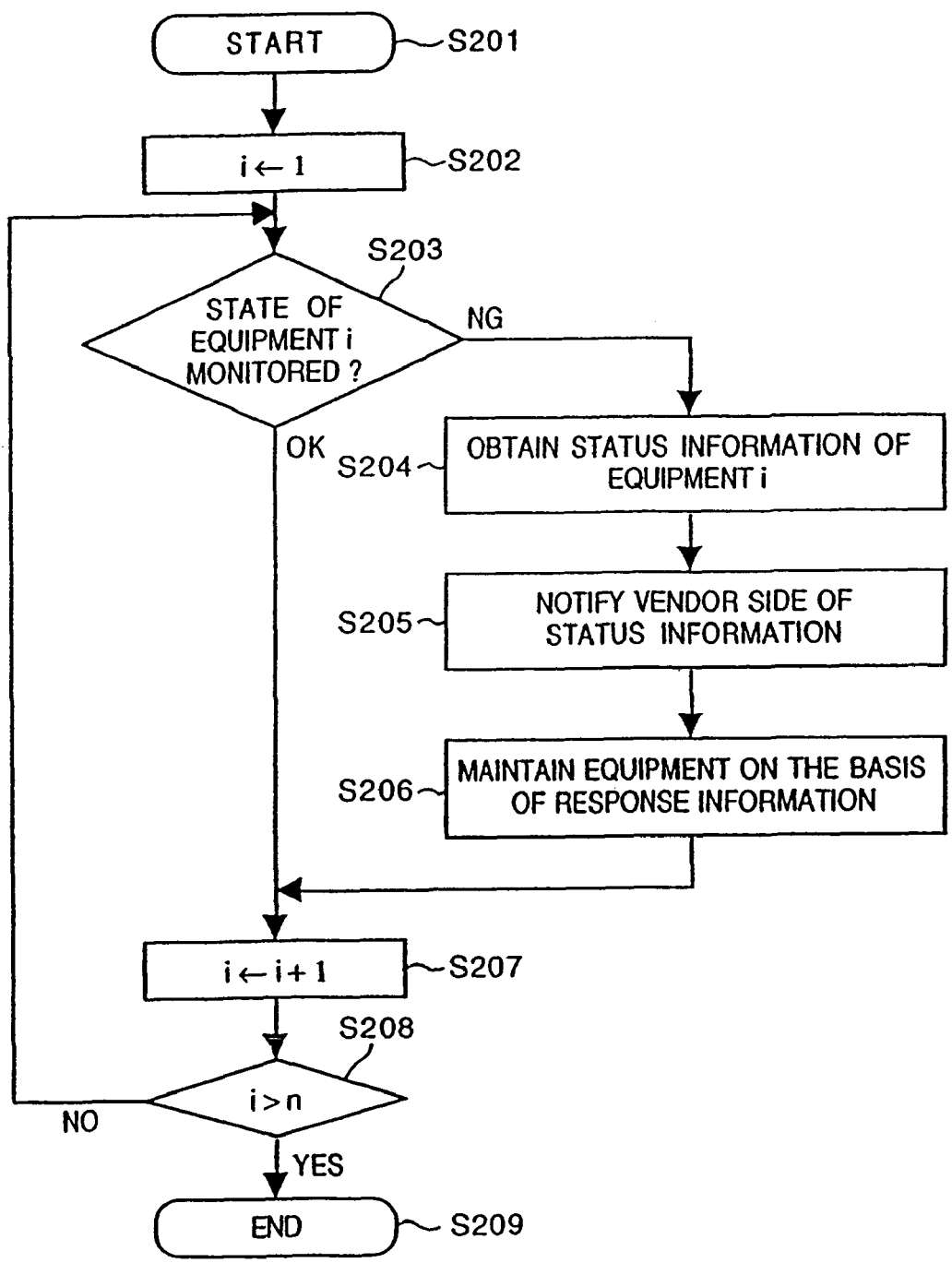
FIG. 2 is a flow chart showing the operation of a host computer serving as a monitor apparatus installed on the user (factory) side.

FIG. 2 is a flow chart showing the operation of the host computer 107 installed in each factory. The host computer 107 periodically executes processing represented by this flow chart to periodically monitor the operating states of the plurality (n) of industrial equipments 106 through the LAN 109. Upon occurrence of a trouble, the host computer 107 obtains status information such as the state of the trouble and notifies the vendor 101 side of them through the internet 105.

In the flow chart of FIG. 2, the host computer 107 identifies and manages the plurality of industrial equipments 106, i.e., the monitor targets, as the first to nth industrial equipments. The host computer 107 sequentially increments a parameter i (steps S207 and S208) and monitors the operating state of the ith industrial equipment (step S203). The host computer 107 obtains the status information about the operating state of an industrial equipment in trouble (step S204) and informs the vendor 101 side of this status information through the internet 105 (step S205). The host computer 107 automatically maintains the industrial equipment in trouble through the LAN 109, if possible (e.g., the trouble can be eliminated by software updating or the like), on the basis of the response information transmitted from the vendor 101 side in response to the report of the status information (step S206). Note that if automatic maintenance against the trouble is impossible, a message representing this is displayed on, e.g., a display.

Each industrial equipment 106 has a function of notifying the corresponding host computer 107 of the presence/absence of a trouble in response to a request from the host computer 107 (corresponding to step S203), and a function of specifying the contents of the trouble and notifying the host computer 107 of the status information (e.g., an error code representing the contents of the trouble) representing the specified contents (corresponding to step S204).

In step S205, the status information notified from the host computer 107 to the vendor 101 side contains, e.g., the model of the industrial equipment in trouble, the serial number, the error code, and trouble occurrence time. The corresponding relationship between the error code and the contents of the trouble can be spontaneously updated from the host computer 108 of the vendor 101 side through the internet 105.

If the contents of a trouble are not registered in advance, an error code representing this may be contained in the status information. In this case, the operator can notify the vendor side of detailed information by means of telephone, facsimile, or E-mail.

Figure 3:
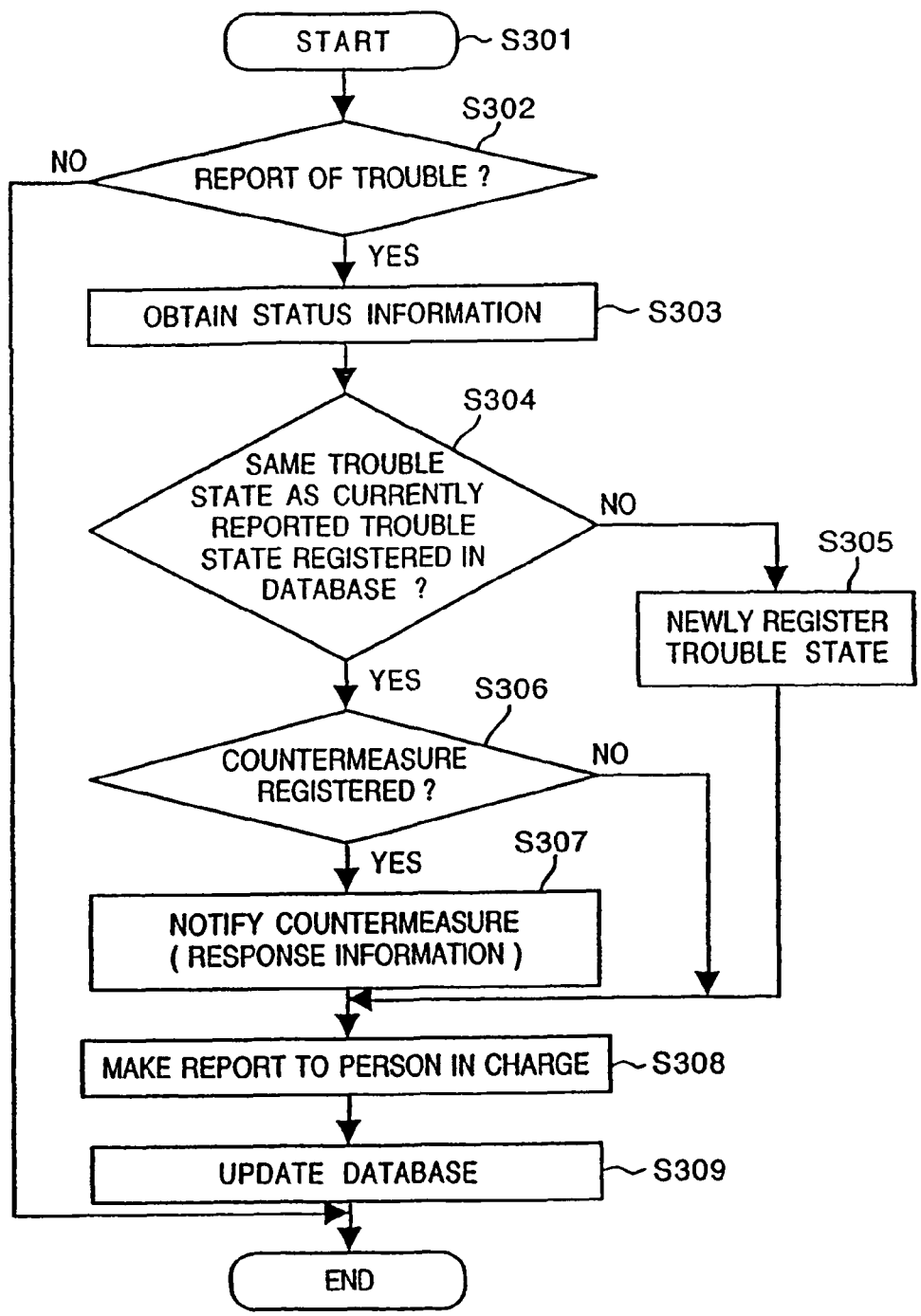
FIG. 3 is a flow chart showing the operation of a host computer serving as a management apparatus installed on the vendor side.

The host computer 108 serving as the management apparatus on the vendor 101 side waits for communication from the host computer 107 in each factory for, e.g., 24 hours. FIG. 3 is a flow chart showing the operation of the host computer 108 on the vendor 101 side.

The host computer 108 on the vendor 101 side periodically executes processing represented by the flow chart in FIG. 3 to monitor the operating states of the industrial equipments 106 of the respective factories 102 to 104.

First, the host computer 108 monitors whether the report of a trouble is present (step S302). If YES in step S302, the host computer 108 obtains status information about this report (step S303). The host computer 108 looks up the trouble database (DB) for managing the maintenance of the industrial equipments of each factory on the basis of this status information. The host computer 108 checks whether the same trouble state as the currently reported trouble state for the same industrial equipment has occurred in the past, i.e., whether the same trouble state is registered in the trouble database (501 to be described later) (step S304).

If the same trouble state is registered in the trouble database ("YES" in step S304), it is determined whether a countermeasure against this trouble state is registered (step S306). If YES in step S306, the host computer 108 notifies the host computer 108, in the factory which has reported the trouble, of response information about the registered countermeasure (e.g., code information or message representing the countermeasure, a countermeasure program, or its data) through the internet 105 (step S307).

Upon reception of the response information, the host computer 107 on the factory side automatically restores the industrial equipment in trouble to a normal state, if possible. When such automatic restoration is impossible, the host computer 107 outputs a message to, e.g., a display for the operator of the industrial equipment in trouble.

The host computer 108 reports, to a person in charge on the vendor 101 side, the fact of occurrence of the trouble, the contents of the trouble (status information), the presence/absence of notification of the countermeasure (response information), the current state, and any other associated information. This report is displayed on the display of the computer 110 and made by automatically transmitting an E-mail from the host computer 108 to the mail address of the person in charge on the vendor side.

If it is determined in step S304 that the same trouble state as the currently reported trouble state is not registered in the trouble database, this trouble state is newly registered in the trouble database (step S305), and then step S308 is executed.

When the report to the operator is complete (step S308), the host computer 108 updates the trouble database (step S309). By this updating, the presence/absence of transmission of the countermeasure (response information), trouble report reception time, and the like are registered in the trouble database.

FIG. 4 is a flow chart showing the flow of the implementation which can be taken by the person in charge in the department of maintenance, who has received the report in step S308. First, the person in charge looks up the trouble database to grasp the contents of a trouble and determines whether a countermeasure is required (step S402). If NO in step S402 (e.g., when an appropriate countermeasure is notified to the corresponding factory in step S307), the operating state of the industrial equipment 106 in trouble is monitored through the internet 105 for, e.g., future occurrence of this trouble (step S404).

If, however, a countermeasure is required (i.e., "YES" in step S402), the person in charge selects an appropriate countermeasure by looking up the information stored in the trouble database (step S403).

As a countermeasure policy, the trouble can be eliminated on-line through the internet 105 (step S407). As an example, the trouble may be caused by a software error. In this case, the parameters and program in the memory of the industrial equipment in trouble may be corrected on-line through the internet 105 and the host computer 107 on the factory side.

As another countermeasure policy, a method of eliminating the trouble may be instructed to the operator by means of E-mail, facsimile, telephone, or the like (step S406).

For a serious trouble which cannot be eliminated by the methods in steps S406 and S407, the person in charge visits the factory to eliminate the trouble (step S405).

When the countermeasure is complete, the person in charge operates the host computer 108 or the computer 110 to update the trouble database on the basis of the information associated with this trouble (step S408).

The trouble database in the host computer 108 on the vendor 101 side will be described below. Dedicated or general-purpose browser software is installed in each computer 110 connected to the host computer 108 through the LAN 109 and the console of the industrial equipment 106 of each factory connected through the internet, thereby constituting, e.g., the user interface window shown in FIG. 5.

The operator on the vendor or factory side can input information such as the model (401) of the industrial equipment, the serial number (402), the case of trouble (403), the date of trouble occurrence (404), the emergency degree (405), the trouble state (406), the countermeasure (407), and progress (408). Note that information may be automatically input to the trouble database by the host computer 108, as described above.

The browser software of the window shown in FIG. 5 has a hyperlink function (410 to 412) which allows each worker in each department of the vendor and each operator in each factory to access detailed information of each item, retrieve a new version of the software from the software library, or retrieve an operation guide (auxiliary information) as the reference for the operator in the factory.

As described above, the worker in each department on the vendor 101 side, such as the department of maintenance, the manufacturing department, and the department of development can access the trouble database by using the computer 110 connected to the host computer 108 through the LAN 109. The outside maintenance personnel can also access the trouble database by using a portable terminal through the internet 105. Therefore, the information of the respective departments of the vendor can be centralized and managed, and each department can always access the latest information.

Information as part of the trouble database can be disclosed to users (factories), and each user can access various kinds of past maintenance information through the internet and employs an appropriate countermeasure against his own trouble. As described above, in this embodiment, the maintenance information can be shared by the vendor and the plurality of users to remarkably improve the maintenance efficiency.

This embodiment also comprises a communication security system for inhibiting the third party from accessing confidential information from the trouble database through the internet.

This system has a fire wall to perform validation using a password, and a computer which is allowed to access the database is registered in the host computer 108 of the vendor 101 in advance, thereby inhibiting access by a computer other than the registered computers.

Figure 6:
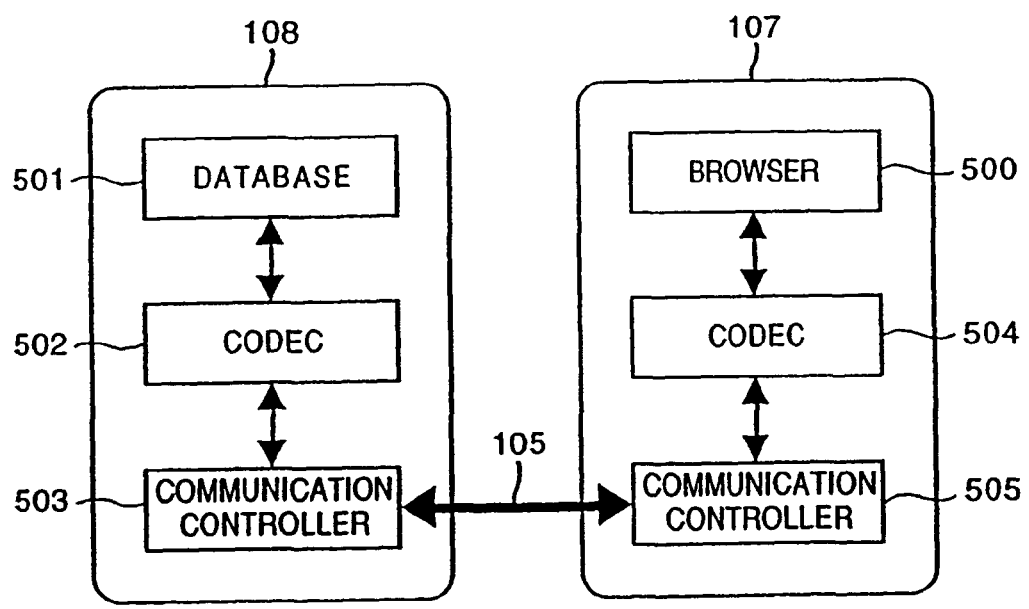
FIG. 6 is a view showing the arrangement of a communication security system.

FIG. 6 is a view showing the arrangement of the communication security system according to this embodiment. Communication for accessing a trouble database 501 of the host computer 108 on the vendor 101 side by using a browser 500 is performed using an encoded packet. The host computers 107 and 108 comprise codecs 502 and 504 and communication controllers 503 and 505. A codec algorithm is provided in each factory (user) (the codecs on the vendor side can cope with a plurality of algorithms). The codec algorithms are periodically changed to improve security.

In the system of this embodiment, as described above, the internet serving as the exiting infrastructure and its communication protocol, and internet access software are used to communicate maintenance information of the industrial equipments. For this reason, loads on installation of dedicated communication lines and development of new software can be reduced, and a high-speed, low-cost remote maintenance system can be constructed.

The plurality of factories in which the industrial equipments are installed are connected to the vendor management system through a communicating means to perform centralized management of maintenance information and share the information. The experiences of the past troubles can be utilized beyond the production sites, thereby immediately coping with troubles. In particular, when maintenance information is shared by different business enterprises as users, the efficiency of the whole industry can be improved.

Second Embodiment of Remote Maintenance System for Industrial Equipment

Figure 7:
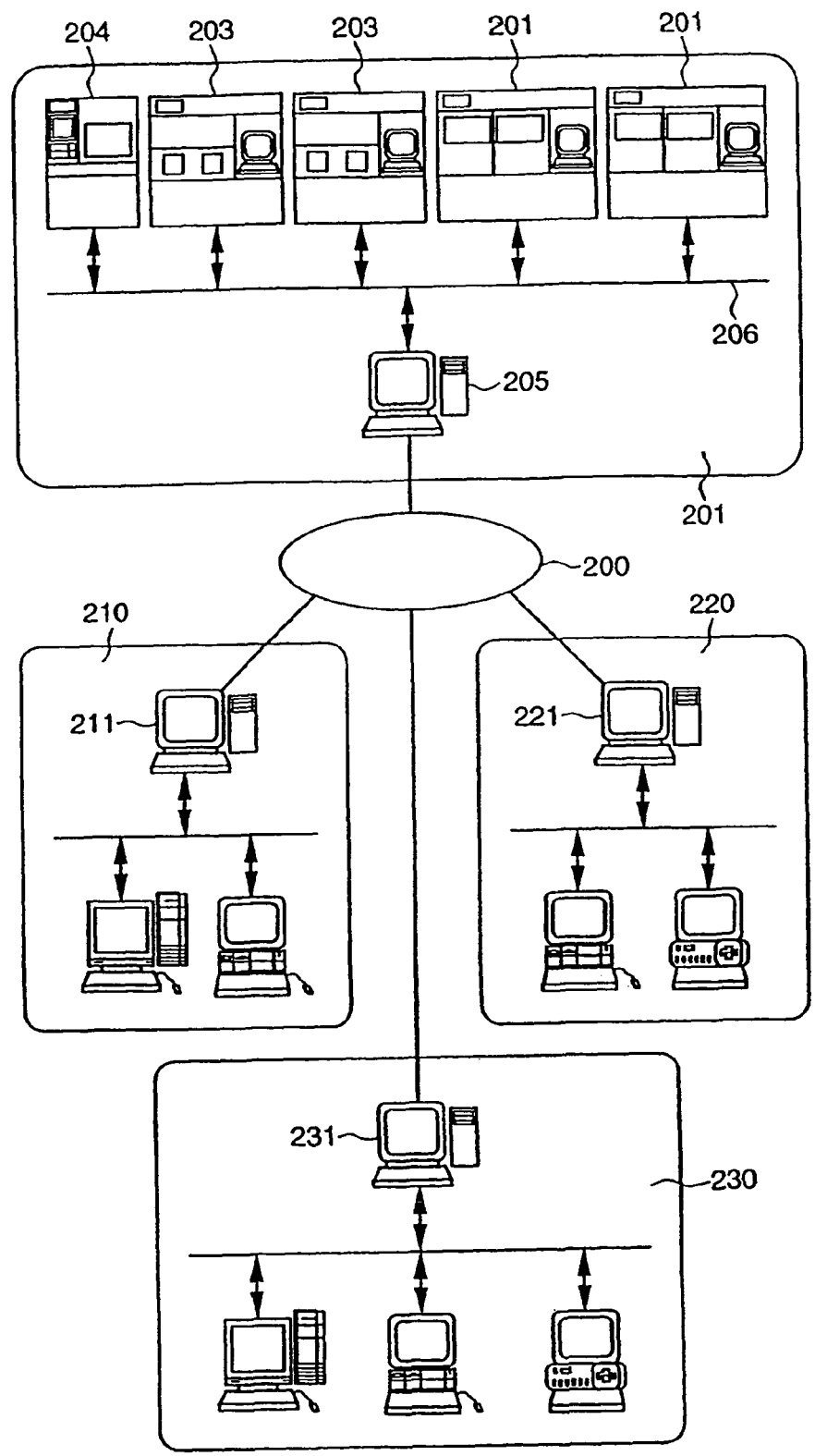
FIG. 7 is a schematic view of a remote maintenance system for an industrial equipment according to the second embodiment of the present invention.

FIG. 7 is a conceptual view of an industrial equipment maintenance system according to the second embodiment of the present invention. In the first embodiment, the plurality of user factories each having the industrial equipment are connected to the management system for the vendor for the industrial equipment through a communicating means, and the maintenance information of the industrial equipment of each factory is communicated through the communicating means. However, in the second embodiment, a factory having industrial equipment of a plurality of vendors is connected to the management systems of the vendors for the plurality of industrial equipment through a communicating means using the internet, thereby communicating maintenance information of each industrial equipment through the communicating means.

Referring to FIG. 7, reference numeral 201 denotes a production factory of an industrial equipment user (semiconductor device manufacturing maker) in which an exposure apparatus 202, a coating/developing apparatus 203, and an annealing apparatus 204, all of which serve as the semiconductor device manufacturing apparatuses, are installed in the production line of the factory. Only one production factory 201 is illustrated in FIG. 7, but a plurality of factories are similarly networked in practice. The above apparatuses are connected through a LAN (intranet) 206, and the operation of the line is managed by a production management host computer 205. Host management systems 211, 221, and 231 for performing remote maintenance of the supply equipments are provided in the offices of the vendors (apparatus supply makers) such as an exposure apparatus maker 210, a coating/developing apparatus maker 220, and an annealing apparatus maker 230. The host computer 205 for managing each apparatus in the production factory of the user is connected to the management systems 211, 221, and 231 of the vendors for the respective apparatuses through the internet 200. As described with reference to FIG. 1, each of the vendors 210, 220, and 230 can perform centralized maintenance management of its own supply apparatuses in the factories of the plurality of users.

In this system, when a trouble has occurred in one of the series of production equipments on the production line, the operation of the production line stops. Remote maintenance is received from the vendor for the equipment in trouble through the internet 200 to immediately cope with the trouble, thereby minimizing the stop period of the production line. The host management system of each vendor has a trouble database as described with reference to the first embodiment. Maintenance information is stored in this trouble database. Different communication security systems are used between the production factory and different vendors to prevent leakage of information. The detailed maintenance contents and method are identical to those of the first embodiment, and a detailed description thereof will be omitted.

As described above, in the system of this embodiment, a plurality of factories of one or a plurality of users, which have industrial equipments of the plurality of vendors on the production line are connected to the management systems of the respective vendors to communicate maintenance information. Even if a given equipment during production gets in trouble, immediate maintenance can be received from the corresponding vendor. The line stop time can be minimized to improve the production efficiency. In particular, when maintenance information is shared by different users, different business enterprises, or different vendors, the efficiency of the whole industry can be improved.

Embodiment of Semiconductor Device Production Method

A semiconductor device production method in a facility using the above-described remote maintenance system will be described below.

Figure 8:
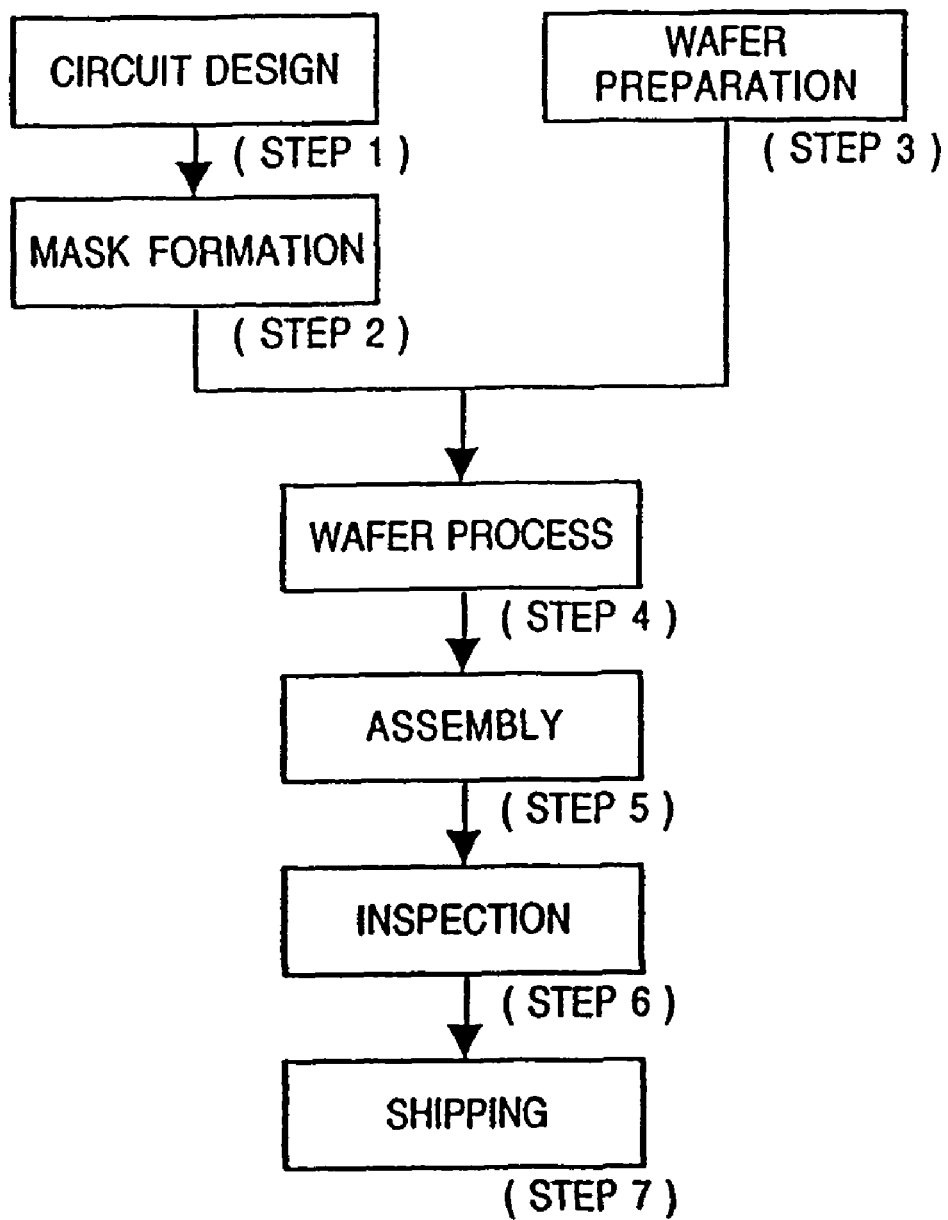
FIG. 8 is a flow chart showing a semiconductor device manufacturing flow.

FIG. 8 is a flow of manufacturing microdevices (e.g., a semiconductor chip such as an IC or LSI, a liquid crystal panel, a CCD, a thin film magnetic head, and a micromachine). In step 1 (circuit design), circuit design for a semiconductor device is performed. In step 2 (mask formation), a mask on which the designed circuit pattern is formed. In step 3 (wafer preparation), a wafer using a material such as silicon is prepared. Step 4 (wafer process) is called a preprocess in which a circuit is actually formed on the wafer using lithography techniques by using the prepared mask and wafer. Step 5 (assembly) is called a postprocess of forming a semiconductor chip by using the wafer processed in step 4 and includes an assembly step (dicing and bonding) and a packaging step (chip sealing). In step 6 (inspection), inspections such as the operation check test and the durability test of the semiconductor device manufactured in step 5 are performed. Through these steps, the semiconductor device is finished. When the semiconductor device is shipped (step 7), the preprocess and postprocess are performed in different dedicated factories, and maintenance is performed for each factory by the remote maintenance system described above.

Figure 9:
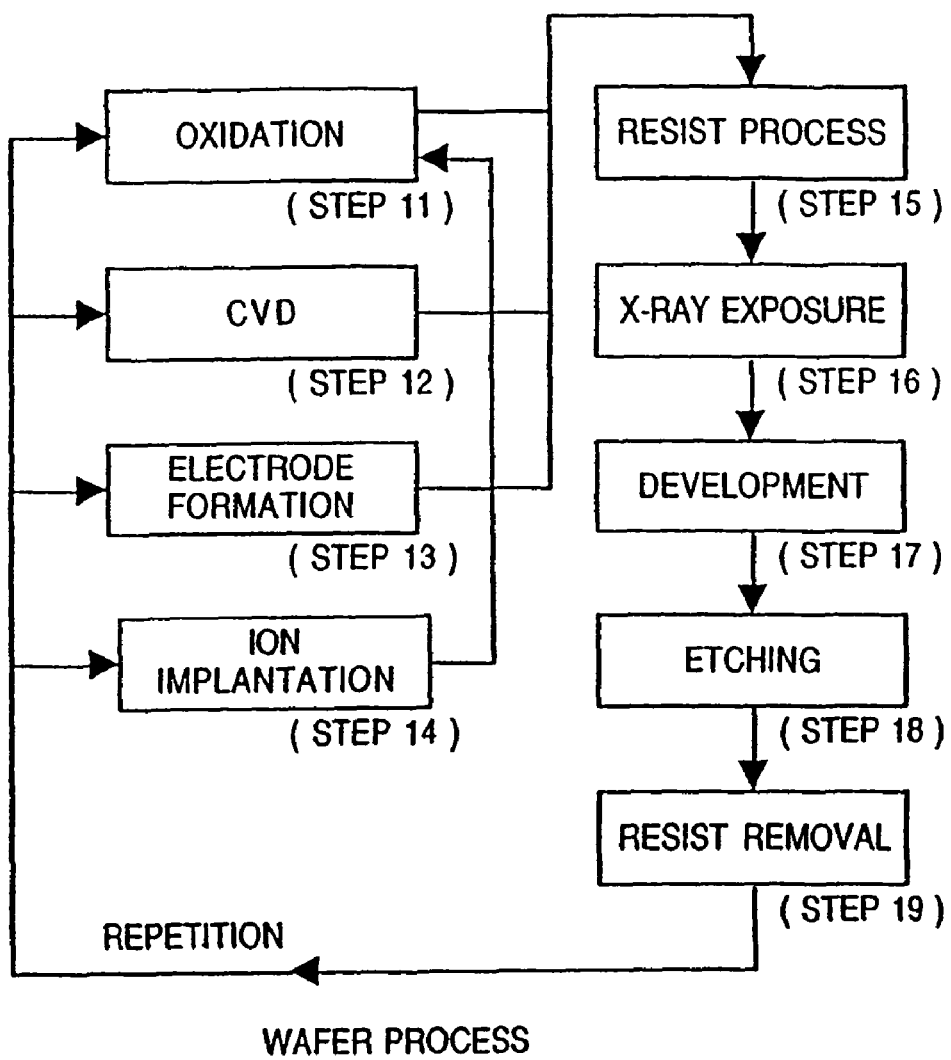
FIG. 9 is a flow chart showing a wafer process.

FIG. 9 shows a flow of the wafer process in detail. In step 11 (oxidation), the surface of the wafer is oxidized. In step 12 (CVD), an insulating film is formed on the wafer surface. In step 13 (electrode formation), an electrode is formed on the wafer by deposition. In step 14 (ion implantation), ions are implanted in the wafer. In step 15 (resist process), the wafer is coated with a photosensitive agent. In step 16 (exposure), the circuit pattern of the mask is printed and exposed by the exposure apparatus. In step 17 (development), the exposed wafer is developed. In step 18 (etching), the nonexposed portion except the developed resist image is removed. In step 19 (resist removal), the unnecessary resist upon etching is removed. These steps are repeatedly performed to form a multiple of circuit patterns on the wafer. The production equipments used in the respectively steps are monitored by the remote maintenance systems described above. Troubles can be prevented in advance. Even if a trouble occurs, immediate restoration can be performed, thereby improving the productivity of semiconductor devices as compared with the conventional case.

As has been described above, according to the present invention, the worldwide internet is used as the remote maintenance communication means for the industrial equipments to allow construction of an effective maintenance system with less capital investment regardless of the installation locations of the equipments.

The user factories in which industrial equipments are installed are connected to the vendor management systems through the communicating means to immediately cope with troubles. In addition, when the maintenance information is shared, the maintenance capability can be expected to be improved.

The present invention is not limited to the above embodiments and various changes and modifications can be made within the spirit and scope of the present invention. Therefore, to apprise the public of the scope of the present invention the following claims are made.

What is claimed is:

1. A remote maintenance apparatus for an industrial equipment, wherein the remote maintenance apparatus is connected to an intranet, and wherein the remote maintenance apparatus comprises:
   a database configured to register information on an abnormal state of the industrial equipment and information on a countermeasure against the abnormal state,
   wherein the remote maintenance apparatus is configured to:
   receive information on the abnormal state of the industrial equipment through an internet from a monitor apparatus which monitors the industrial equipment;

determine whether information on the countermeasure against the abnormal state of the received information is registered in the database;

transmit the information on the countermeasure through the internet to the monitor apparatus, wherein the information on the countermeasure is transmitted if it is determined that the information on the countermeasure is registered in the database; and transmit a report regarding whether the registered information on the countermeasure has been transmitted to the monitor apparatus, wherein the report is transmitted to a computer connected to the intranet to which information that represents the countermeasure is to be input by an operator; and register in the database information that represents the countermeasure against the abnormal state of the received information based on the information that represents the countermeasure which is input to the computer by an operation of the operator.

2. A remote maintenance apparatus according to claim 1, wherein the remote maintenance apparatus is configured to transmit to the monitor apparatus at least one of information selected from information of a code and a message representing the countermeasure, and a program and data for the countermeasure as the information on the countermeasure.

3. A remote maintenance apparatus according to claim 1, wherein the remote maintenance apparatus is configured to execute remote maintenance for a plurality of industrial equipment based on information on an abnormal state from a plurality of monitor apparatuses.

4. A remote maintenance apparatus according to claim 1, the remote maintenance apparatus further comprising an encryption and decryption unit configured to encrypt and decrypt communication data to and from the monitor apparatus, respectively.

5. A remote maintenance apparatus according to claim 1, wherein the industrial equipment includes a semiconductor device manufacturing apparatus.

6. A remote maintenance system comprising a remote maintenance apparatus according to claim 1 and a monitor apparatus configured to monitor an industrial equipment.

7. A remote maintenance method for an industrial equipment by a remote maintenance apparatus connected to an intranet, wherein the remote maintenance method comprises:

a reception step of receiving information on an abnormal state of the industrial equipment through an internet from a monitor apparatus which monitors the industrial equipment;

a determination step of determining whether information on a countermeasure against the abnormal state of the received information is registered in a database configured to register information on the abnormal state and information on the countermeasure against the abnormal state;

a first transmission step of transmitting the information on the countermeasure through the internet to the monitor apparatus, wherein the information on the countermeasure is transmitted if it is determined that the information on the countermeasure is registered in the database in the determination step;

a second transmission step of transmitting a report regarding whether the registered information on the countermeasure has been transmitted to the monitor apparatus in the first transmission step, wherein the report is transmitted to a computer connected to the intranet to which information that represents the countermeasure is to be input by an operator; and a registering step of registering in the database information that represents the countermeasure against the abnormal state of the received information based on the information that represents the countermeasure which is input to the computer by an operation of the operator.

8. A remote maintenance method according to claim 7, wherein the first transmission step transmits at least one of information of a code and a message representing the countermeasure, and a program and data for the countermeasure as the information on the countermeasure.

9. A remote maintenance method according to claim 7, wherein remote maintenance for a plurality of industrial equipment is executed based on information on an abnormal state from a plurality of monitor apparatuses.

10. A remote maintenance method according to claim 7, wherein communication data to and from the monitor apparatus are respectively encrypted and decrypted.

11. A remote maintenance method according to claim 7, wherein the industrial equipment includes a semiconductor device manufacturing apparatus.

* * * * *